United States Patent [19]

Nozaki et al.

[11] Patent Number: 4,482,825
[45] Date of Patent: Nov. 13, 1984

[54] SEMICONDUCTOR DEVICE HAVING A CIRCUIT FOR GENERATING A VOLTAGE HIGHER THAN A SUPPLY VOLTAGE AND RESPONSIVE TO VARIATIONS IN THE SUPPLY VOLTAGE

[75] Inventors: Shigeki Nozaki, Kawasaki; Yoshihiro Takemae, Yokohama; Katsuhiko Kabashima, Kawasaki; Seiji Enomoto, Yokohama, all of Japan

[73] Assignee: Fujitsu Limited, Kawasaki, Japan

[21] Appl. No.: 326,899

[22] Filed: Dec. 2, 1981

[30] Foreign Application Priority Data

Dec. 3, 1980 [JP] Japan .................. 55-170748

[51] Int. Cl.$^3$ ............... H03K 17/06; H03K 17/14; H03K 17/16; H01L 27/02
[52] U.S. Cl. .................... 307/578; 307/530; 307/584; 307/303; 365/214; 357/23
[58] Field of Search ............ 307/303, 304, 279, 530, 307/482, 577, 578, 443, 585, 200 A, 491, 584; 357/23 C, 84; 365/214, 206, 63, 51

[56] References Cited

U.S. PATENT DOCUMENTS

| | | |
|---|---|---|
| 3,646,369 | 2/1972 | Fujimoto . |
| 4,115,795 | 9/1978 | Masuoka et al. ............ 357/23 C X |
| 4,121,240 | 10/1978 | Katto .................. 357/84 X |
| 4,131,906 | 12/1978 | Kinoshita ................ 357/23 C X |
| 4,197,554 | 4/1980 | Meusburger et al. ........ 357/23 C X |
| 4,250,414 | 2/1981 | Kirsch . |
| 4,369,379 | 1/1983 | Hull ................. 307/481 X |
| 4,398,106 | 8/1983 | Davidson et al. ......... 307/200 A X |

OTHER PUBLICATIONS

IEEE Journal of Solid-State Circuits, vol. SC-16, No. 5, Oct., 1981, New York, pp. 495-498.

*Primary Examiner*—Larry N. Anagnos
*Assistant Examiner*—David R. Bertelson
*Attorney, Agent, or Firm*—Staas & Halsey

[57] ABSTRACT

In a semiconductor device having a signal line on which a voltage higher than the voltage supply is generated, a conductive layer following the potential variance of the voltage supply is positioned under an insulating film directly below the signal line in order to make the level of the signal line follow the potential variance of the voltage supply.

5 Claims, 7 Drawing Figures

SEMICONDUCTOR DEVICE HAVING A CIRCUIT FOR GENERATING A VOLTAGE HIGHER THAN A SUPPLY VOLTAGE AND RESPONSIVE TO VARIATIONS IN THE SUPPLY VOLTAGE

BACKGROUND OF THE INVENTION

1. Field of the Invention

This invention relates to a semiconductor device, and especially relates to a semiconductor device comprising a signal line in which a voltage higher than the voltage supply is generated.

2. Description of the Prior Art

Recently, the voltage supply $V_{CC}$ of a dynamic RAM (Random Access Memory) using MOS transistors has been lowered by degrees, and is in general $V_{CC}=5$ V. However, the electric charge accumulated in the memory cell in the case of $V_{CC}=5$ V is less than that in the case of $V_{CC}=12$ V or another higher voltage. Accordingly, the charging condition in the memory cell in the case of $V_{CC}=5$ V is disadvantageous for carrying out a refresh action and is apt to be influenced by $\alpha$-rays and so on, and therefore it becomes necessary to generate a voltage higher than the voltage supply $V_{CC}$ at the signal line by using a bootstrap circuit, a push-up circuit, or another type of circuit in order to utilize the $V_{CC}$ level as much as possible.

A dynamic RAM semiconductor device in which a push-up circuit is used for the above-mentioned purpose is illustrated in FIG. 1. As illustrated in FIG. 1, this device has a push-up circuit PU, a precharger circuit PRE for the pair of bit lines BL and $\overline{BL}$ which are driven by the output of the push-up circuit PU, and the sense amplifier circuit SA for the memory cells. FIG. 2 illustrates various voltage waveforms used to explain the operation of the push-up circuit PU of FIG. 1.

The push-up circuit PU consists of transistors $Q_1$ and $Q_2$, a push-up capacitor $C_1$ and an output signal line $S_1$ as illustrating in FIG. 1. A clock signal $\phi_1$ is applied as an input to the gate of the transistor $Q_1$ and another clock signal $\phi_2$ is applied to the gate of the transistor $Q_2$. As illustrated in FIG. 2, at first, the clock $\phi_1$ is at the L(low) level and the clock $\phi_2$ is at the H(high) level so that the transistor $Q_1$ is OFF and the transistor $Q_2$ is ON; therefore, the level of the output signal line $S_1$ is kept at the L level ($V_{SS}$). Then, the clock $\phi_2$ falls to the L level to turn off the transistor $Q_2$; after that, the clock $\phi_1$ rises to the H level (higher than $V_{CC}$) to fully turn on the transistor $Q_1$ so that the signal line $S_1$ is charged up to the $V_{CC}$ level. Under this condition, the clock $\phi_1$ falls to the L level to turn off the transistor $Q_1$, and therefore the signal line $S_1$ is cut off from the voltage supply line $V_{cc}$. Then, the clock $\phi_3$ rises from the L level ($V_{SS}$) to the H level ($V_{CC}$) so that the level of the signal line $S_1$ is pushed up to a level $V_{S1}$ higher than the voltage supply $V_{CC}$ through the capacitor $C_1$.

This voltage level $V_{S1}$ of the signal line $S_1$ is applied as an input to the precharger circuit PRE. As illustrated in FIG. 1, the precharger circuit PRE consists of transistors $Q_3$, $Q_4$ and $Q_5$. The signal line $S_1$ is connected to all the gates of the transistors $Q_3$, $Q_4$ and $Q_5$. The drains of the transistors $Q_3$ and $Q_4$ are connected to the voltage supply $V_{CC}$, and the sources of the transistors $Q_3$ and $Q_4$ are connected to the pair of bit lines BL and $\overline{BL}$, respectively. The drain and source of the transistor $Q_5$ are connected to the pair of bit lines BL and $\overline{BL}$, respectively.

The sense amplifier circuit SA consists of transistors $Q_6$, $Q_7$ and $Q_8$ as illustrated in FIG. 1. The drain of the transistor $Q_6$ and the gate of the transistor $Q_7$ are both connected to one line BL of the pair of bit lines, and the gate of the transistor $Q_6$ and the drain of the transistor $Q_7$ are both connected to another line $\overline{BL}$ of the pair of bit lines. The sources of the transistors $Q_6$ and $Q_7$ are both connected to the drain of the transistor $Q_8$, and the source of the transistor $Q_8$ is connected to the reference voltage $V_{SS}$. The clock signal $\phi_4$ is applied to the gate of the transistor $Q_8$.

Transistors $Q_9$, $Q_9'$ ... of the memory cells MC corresponding to the word lines $WL_1$, $WL_1'$ ... are all connected to one line BL of the pair of bit lines, and transistors $Q_{10}$, $Q_{10}'$ ... of the memory cells MC corresponding to the word lines $WL_2$, $WL_2'$ ... are all connected to another line $\overline{BL}$ of the pair of bit lines. For example, if the content of the memory cell MC including the transistor $Q_9$ is "1" and the word line $WL_1$ is selected, when the clock $\phi_4$ rises from the L level to the H level to turn on the transistor $Q_8$, the sense amplifier circuit SA operates to turn off the transistor $Q_6$ and to turn on the transistor $Q_7$ so that the levels of the pair of bit lines are BL=H and $\overline{BL}$=L. And if the content of the above-mentioned memory cell MC is "0", then the circuit SA operates to turn on the transistors $Q_6$ and to turn off the transistor $Q_7$ so that the levels of the pair of bit lines are BL=L and $\overline{BL}$=H.

In the sense amplifier circuit SA, preceding the above-mentioned sense action, it is necessary to precharge the pair of bit lines BL and $\overline{BL}$ so as to make the potentials of the pair of bit lines BL and $\overline{BL}$ equal to each other. In order to do so, when the clock $\phi_1$ rises to the H level as illustrated in FIG. 2, the gate voltages of the transistors $Q_3$, $Q_4$ and $Q_5$ rise to the $V_{CC}$ level through the signal line $S_1$ and the pair of bit lines BL and $\overline{BL}$ are charged up from the voltage supply $V_{CC}$ through the transistors $Q_3$ and $Q_4$, respectively. The transistor $Q_5$ is connected between the pair of bit lines BL and $\overline{BL}$, and it becomes conductive in order to make the potentials of the pair of bit lines BL and $\overline{BL}$ equal to each other. However, in the above-mentioned condition, the level of the signal line $S_1$ is nearly equal to the voltage supply $V_{CC}$ so that the transistors $Q_3$, $Q_4$ and $Q_5$ are not turned on fully, and therefore the potentials of the pair of bit lines BL and $\overline{BL}$ are lower than $V_{CC}$ and are not completely equal to each other. Then, when the clock $\phi_1$ falls to the L level and the clock $\phi_3$ rises to the H level, the level of the signal line $S_1$ rises from $V_{CC}$ to $V_{S1}$ higher than $V_{CC}$ so that the transistors $Q_3$, $Q_4$ and $Q_5$ are fully turned on and the pair of bit lines BL and $\overline{BL}$ are both charged up to the voltage supply level $V_{CC}$.

By the way, the level $V_{S1}$ of the signal line $S_1$ is determined not only by the voltage supply $V_{CC}$ and the level $V_{\phi 3}$ of the clock $\phi_3$ (in this case, $V_{\phi 3}=V_{CC}$) but is also determined by the push-up capacitor $C_1$, the capacitor $C_2$, which is formed along the wiring path of the signal line $S_1$, and the capacitance $C_3$ at the gates of the transistors $Q_3$, $Q_4$ and $Q_5$. Thus, the level $V_{S1}$ of the signal line $S_1$ is expressed by the following equation:

$$V_{S1} = V_{cc} + V_{\phi 3} \cdot \frac{C_1}{C_1 + C_2 + C_3} \quad (1)$$

In order to charge up the pair of bit lines BL and $\overline{BL}$ to the voltage supply level $V_{CC}$, it is necessary that the second term of the right side of the equation (1) be greater than the threshold voltage $V_{th}$ of the transistors $Q_3$, $Q_4$ and $Q_5$.

However, even if the condition $V_{S1} \geq V_{CC}+V_{th}$ is fulfilled in the case of $V_{CC}=5$ V and the pair of bit lines BL and $\overline{BL}$ are both charged up to the voltage supply level $V_{CC}$, the voltage supply $V_{CC}$ may rise from 5 V to 5.5 V ($V_{CC}+\Delta V_{CC}$) after that. In such a case, the value of "$V_{CC}$" in the equation (1) will remain 5 V because at this time the clock $\phi_1$ has already fallen enough so that the transistor $Q_1$ is turned off. Accordingly, the response of the level of the signal line $S_1$ to the variance of the voltage supply $V_{CC}$ depends mainly on the dependence of the clock $\phi_3$ upon the voltage supply $V_{CC}$. An increase in the level of the signal line $S_1$ can be expressed by the following equation:

$$\Delta V_{s1} = \Delta V_{\phi 3} \cdot \frac{C_1}{C_1 + C_2 + C_3} \quad (2)$$

Therefore, even if the clock $\phi_3$ directly follows the variance of the voltage supply $V_{CC}$, the level of the signal line $S_1$ may increase only a little compared with the increase of $V_{CC}$, especially if the capacitor $C_2$ is relatively large (that is, the path of the signal line $S_1$ is long). Therefore, if the voltage supply $V_{CC}$ is changed, it may be that the level $V_{S1}$ of the signal line $S_1$ cannot be higher than the required level ($V_{CC}+V_{th}$). In such a case, the short-circuit between the pair of bit lines BL and $\overline{BL}$ through the transistor $Q_5$ is insufficient so that the sense amplifier circuit SA may make an error.

In addition to the voltage supply $V_{CC}$, the potentials of the electrodes X adjacent the signal line $S_1$ forming the capacitor $C_2$ might be thought of as another factor in relation to the response of the level $V_{S1}$ of the signal line $S_1$. In the semiconductor device of the prior art, the signal line $S_1$ is formed to run the shortest path between the push-up circuit PU and the precharger circuit PRE, and therefore the adjacent electrodes along the path of the signal line $S_1$ may be locally adjacent the ground line $V_{SS}$, the semiconductor substrate itself, the other signal line, the node in the circuit or the voltage supply line $V_{CC}$. However, the proportion of the path of the signal line $S_1$ adjacent the voltage supply $V_{CC}$ is generally small, and the potential of the adjacent electrode X as a whole could be thought of as being other than the voltage supply $V_{CC}$. Accordingly, in the semiconductor device of the prior art, improvement of the response of the level $V_{S1}$ to $V_{CC}$ according to the adjacent electrode X can not be expected.

Thus, as described above, when the voltage supply $V_{CC}$ increases by $\Delta V_{CC}$, the increase of the level $V_{S1}$ of the signal line $S_1$ is only $\Delta V_{S1}$ in the equation (2), and therefore it is difficult to push up the level $V_{S1}$ to a level higher than ($V_{CC}+V_{th}$) after $V_{CC}$ has increased even if the clock $\phi_3$ increases by $\Delta V_{CC}$.

SUMMARY OF THE INVENTION

The main object of the present invention is to solve the above-mentioned problem of the semiconductor device of the prior art, and to provide a semiconductor device which can operate stably even when the voltage supply varies by shielding the signal line generating a voltage higher than the voltage supply with the voltage supply line.

In accordance with the present invention, there is provided a semiconductor device which includes a signal generating circuit in which the output terminal of the signal generating circuit is cut off from the voltage supply line and an output signal higher than the voltage supply is generated at the output terminal, a signal line layer connected to the output terminal, and a transistor, the gate of which is connected to the signal line layer and the drain of which is connected to the voltage supply line at least after the output terminal is cut-off from the voltage supply line, characterized in that the semiconductor device also includes means for following the voltage supply, which means makes the potential of the signal line layer follow the potential variance of the voltage supply line after the signal line layer is cut-off from the voltage supply line.

DESCRIPTION OF THE PREFERRED EMBODIMENTS

Figure 3A:
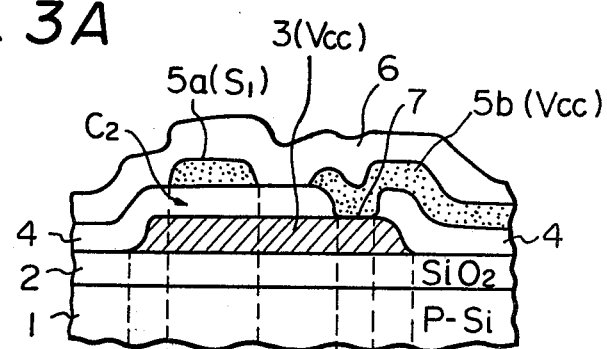
FIGS. 3A and 3B illustrate, respectively, a sectional view and a plan pattern view of a semiconductor device in accordance with one embodiment of the present invention.
Figure 3B:
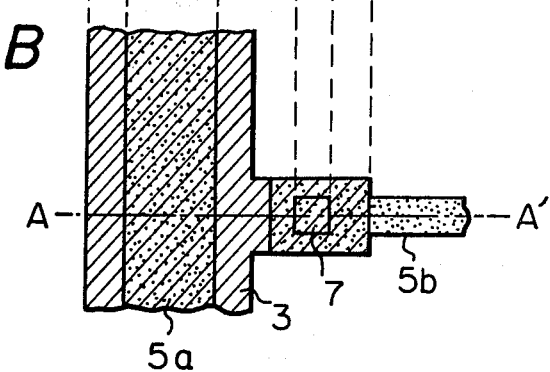

A semiconductor device in accordance with one embodiment of the present invention is illustrated in FIGS. 3A and 3B. FIG. 3A illustrates a principal sectional view of the above-mentioned semiconductor device and FIG. 3B illustrates a plan pattern view of the device.

The semiconductor device of FIGS. 3A and 3B comprises a p-type silicon semiconductor substrate 1, a silicon dioxide ($SiO_2$) layer 2 on the surface of the substrate 1, a polycrystal silicon layer 3 formed on the $SiO_2$ layer 2, a phosphosilicate glass (PSG) layer 4 for insulating between layers formed on the polycrystal silicon layer 3, aluminum (Al) wiring layers 5a and 5b upon the PSG layer 4, and a PSG layer 6 for covering the surface of the device.

The Al wiring layer 5b is a voltage supply ($V_{CC}$) line and is connected through the contact hole 7 to the polycrystal silicon layer 3, which is also used as a voltage supply line. The other Al wiring layer 5a is a signal line $S_1$.

As illustrated in FIG. 3A, the polycrystal silicon layer 3 is arranged to be laid under the Al wiring layer 5A with the insulating PSG laywer 4 between them as much as possible, in order to increase the capacitance formed by the polycrystal silicon layer 3 and the Al wiring layer 5a. There are two ways to arrange the polycrystal silicon layer 3 as described above. One way is to change the wiring pattern of the Al wiring layer 5A so that the path of the Al wiring layer 5A runs on the area under which the polycrystal silicon layer 3 is formed with the insulating PSG layer 4 thereupon. The other way is to change the layout pattern of the polycrystal silicon layer 3 so that the polycrystal silicon layer 3 is laid under the Al wiring layer 5a with the insulating PSG layer 4 between them. In accordance with the embodiment of FIG. 3A, the latter way is adopted. The pattern of the Al wiring layer 5A is not changed and the polycrystal silicon layer 3 is formed under the Al wiring layer 5a with the insulating PSG layer 4 between them, even though the layer 3 is not necessary there, from the viewpoint of other circuit pattern design requirements.

Figure 4:
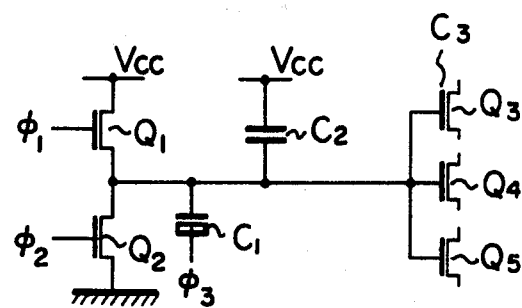
FIG. 4 illustrates an equivalent circuit diagram of the semiconductor device of FIGS. 3A and 3B.

FIG. 4 illustrates an equivalent circuit diagram of the signal line $S_1$ of the semiconductor device of FIG. 3A. According to the semiconductor device of FIG. 3A, the electrodes adjacent the signal line $S_1$ mainly have the potential of the voltage supply $V_{CC}$, and the portions of the signal line $S_1$ adjacent the potentials other than the voltage supply $V_{CC}$ are considered to be negligibly small. Accordingly, the potential at one side of the capacitor $C_2$ which is formed along the path of the signal line $S_1$, is considered to be the voltage supply $V_{CC}$ as simplified.

Figure 1:
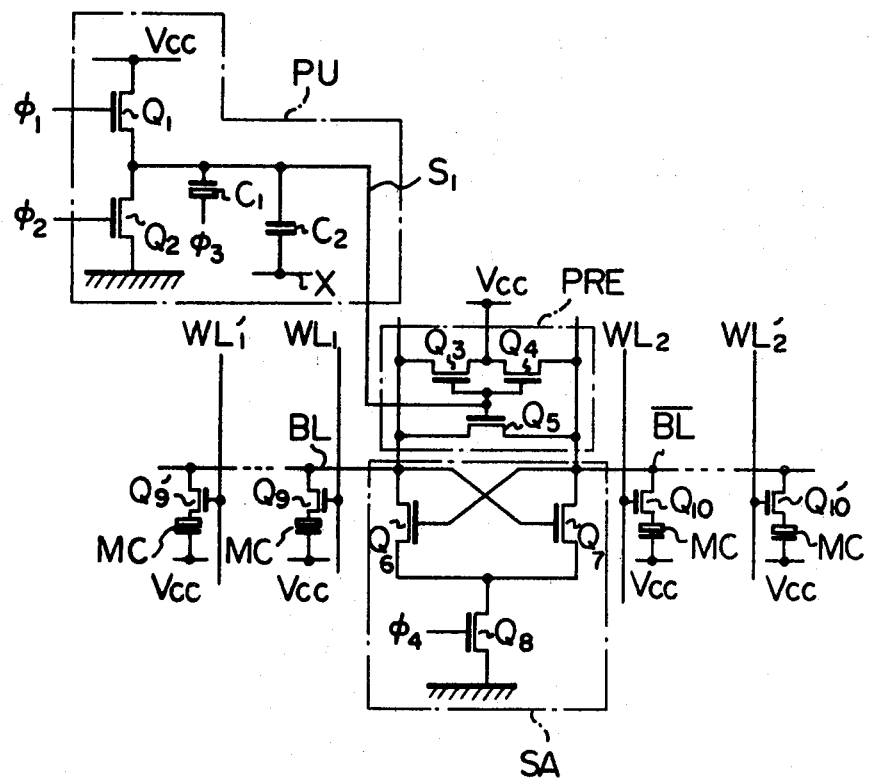
FIG. 1 illustrates a circuit diagram of a semiconductor device of the dynamic RAM of a prior art.
Figure 2:
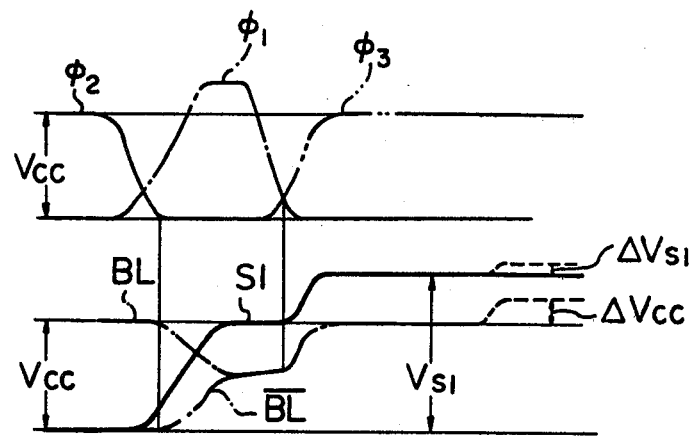
FIG. 2 illustrates various signal waveforms for explaining the operation of the circuit of FIG. 1.

In the circuit of FIG. 4, when the clocks $\phi_1$, $\phi_2$ and $\phi_3$ are changed as illustrated in FIG. 2, the level $V_{S1}$ of the signal line $S_1$ is expressed by the above-mentioned equation (1). If, after the clock $\phi_1$ falls to the L level to cut off the signal line $S_1$ from the voltage supply line $V_{CC}$, the voltage supply $V_{CC}$ rises by $\Delta V_{CC}$, the level $V_{S1}$ of the signal line $S_1$ is pushed up not only by the clock $\phi_3$ through the capacitor $C_1$ but also by the voltage supply itself through the capacitor $C_2$. Therefore, the level $V_{S1}$ of the signal line $S_1$ would increase by $\Delta V_{S1}$ as expressed by the following equation:

$$\Delta V_{s1} = \Delta V_{\phi 3} \cdot \frac{C_1}{C_1 + C_2 + C_3} + \Delta V_{cc} \cdot \frac{C_2}{C_1 + C_2 + C_3} \quad (3)$$

As described above, in the semiconductor device of FIG. 3A, the level of the signal line $S_1$ can follow the variance of the voltage supply $V_{CC}$ even after the signal line $S_1$ is cut off from the voltage supply line $V_{CC}$.

Figure 5A:
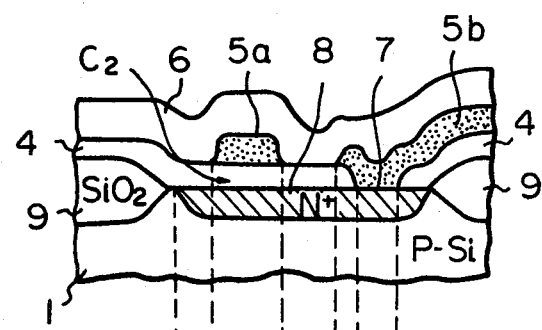
FIGS. 5A and 5B illustrate, respectively, a sectional view and a plan pattern view of a semiconductor device in accordance with another embodiment of the present invention.
Figure 5B:
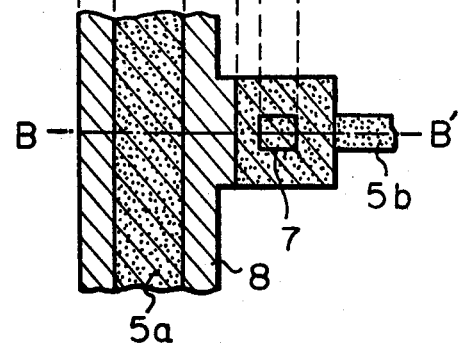

In addition, a semiconductor in accordance with another embodiment of the present invention is illustrated in FIGS. 5A and 5B. FIG. 5A illustrates a principal sectional vview of the above-mentioned semiconductor device and FIG. 5B illustrates a plan pattern view of the device. In the semiconductor device of FIG. 5A, an N+-type diffusion layer 8 is formed upon a portion of the surface of the p-type silicon substrate 1, and a PSG layer 4 for insulating between layers is formed upon the silicon dioxide (SiO₂) film 9 on the substrate 1 and upon the N+-type diffusion layer 8. Al wiring layers 5a and 5b for the signal line $S_1$ and for the voltage supply line $V_{CC}$, respectively, are formed on the insulating PSG layer 4. A covering PSG layer 6 is formed on the surface of the device. The Al wiring layer 5b is connected to the N+-type diffusion layer 8 through the contact hole 7. Therefore, a voltage supply wiring layer formed from the N+-type diffusion layer 8 is provided directly under the Al wiring layer 5a of the signal line $S_1$ separated by the insulating PSG layer 4 thus forming capacitor $C_2$.

Furthermore, though the conductive layer under the signal line $S_1$ is formed as a voltage supply wiring line in the above-mentioned two embodiments, the above-mentioned conductive layer may be formed as a signal line other than the voltage supply line which follows the variance of the voltage supply $V_{CC}$. However, it is not preferable from the view of the drive capacity of the clock $\phi_3$, to form the above-mentioned conductive layer as the output signal line of the clock $\phi_3$.

As described above, according to the present invention, by means of extending the voltage supply line or another signal line equivalent to the voltage supply as much as possible under the output signal line of a push-up circuit or another circuit, the above-mentioned output signal line can be shielded equivalently, the level of the output signal line can follow the variance of the voltage supply by the capacitor formed along the output signal line, and the level of the output signal line can be made so that it is difficult for it to be influenced by the variance of the substrate potential.

We claim:

1. A semiconductor device comprising:
   a voltage supply means for providing power;
   signal generating circuit means, having an output node, for cutting said voltage supply means off from said output node and for generating at said output node a first output signal having a voltage higher than that of said voltage supply means;
   a signal line layer connected to said output node;
   a transistor including a source for providing a second output signal, a gate connected to said signal line layer and a drain connected to said voltage supply means at least at a time after said output node is cut off from said voltage supply means; and
   means for following the potential of said voltage supply means by making the potential of said signal line layer follow the potential of said voltage supply means after said signal line layer is cut off from said voltage supply means.

2. A semiconductor device as defined in claim 1, wherein said means for following the potential of said voltage supply means comprises a conductive layer following the potential variance of said voltage supply means and is positioned under an insulating film and directly below said signal line layer.

3. A semiconductor device as defined in claim 2, wherein said conductive layer following the potential variance of said voltage supply means is a voltage supply line layer positioned under the insulating film and directly below said signal line layer.

4. A semiconductor device as defined in claim 2, wherein said conductive layer following the potential variance of said voltage supply means is formed as a polycrystal silicon layer.

5. A semiconductor device as defined in claim 2, wherein said conductive layer following the potential variance of said voltage supply means comprises one of an N+-type and p+-type diffusion layer.

* * * * *

UNITED STATES PATENT AND TRADEMARK OFFICE
CERTIFICATE OF CORRECTION

PATENT NO. : 4,482,825
DATED : November 13, 1984
INVENTOR(S) : Nozaki et al.

It is certified that error appears in the above-identified patent and that said Letters Patent is hereby corrected as shown below:

Column 1, line 34, "the" (3rd occurrence) should be --a--;

line 40, "illustrating" should be --illustrated--.

Column 2, line 65, example 1, "C11" should be --$C_1$--.

Column 3, line 18, example 2, "$\Delta V_{s1}$" should be --$\Delta V_{S1}$--.

Signed and Sealed this

Twenty-ninth Day of September, 1987

Attest:

DONALD J. QUIGG

Attesting Officer

Commissioner of Patents and Trademarks